(12) United States Patent
Ichimura et al.

(10) Patent No.: US 7,741,850 B2
(45) Date of Patent: Jun. 22, 2010

(54) ELECTRIC POTENTIAL MEASURING APPARATUS, AND IMAGE FORMING APPARATUS

(75) Inventors: Yoshikatsu Ichimura, Setagaya-ku (JP); Yoshitaka Zaitsu, Kawasaki (JP); Takashi Ushijima, Yokohama (JP); Atsushi Kandori, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 12 days.

(21) Appl. No.: 11/385,392

(22) Filed: Mar. 21, 2006

(65) Prior Publication Data
US 2006/0158196 A1    Jul. 20, 2006

Related U.S. Application Data

(62) Division of application No. 11/178,649, filed on Jul. 11, 2005, now Pat. No. 7,049,804.

(30) Foreign Application Priority Data

Jul. 12, 2004 (JP) ............................. 2004-204531
Oct. 8, 2004 (JP) ............................. 2004-297017

(51) Int. Cl.
*G01R 29/12* (2006.01)
(52) U.S. Cl. ...................... 324/457; 324/658
(58) Field of Classification Search ................ 324/457, 324/458, 688, 109
See application file for complete search history.

(56) References Cited

U.S. PATENT DOCUMENTS

| | | | |
|---|---|---|---|
| 4,797,620 A * | 1/1989 | Williams .................. 324/458 |
| 4,878,017 A * | 10/1989 | Williams .................. 324/109 |
| 4,894,607 A * | 1/1990 | Kumada .................. 324/96 |
| 5,155,576 A | 10/1992 | Mizushima | |
| 5,315,232 A * | 5/1994 | Stewart .................. 324/72 |
| 5,315,254 A * | 5/1994 | Wang et al. .................. 324/452 |
| 6,177,800 B1 | 1/2001 | Kubby | |
| 6,452,399 B1 * | 9/2002 | Werner, Jr. .................. 324/458 |
| 6,611,168 B1 * | 8/2003 | Denison et al. .................. 330/4.5 |
| 6,628,501 B2 | 9/2003 | Toyoda | |
| 6,661,232 B1 * | 12/2003 | Horiguchi .................. 324/457 |
| 6,785,111 B1 * | 8/2004 | Osborne .................. 361/152 |
| 6,965,239 B2 * | 11/2005 | Yasuda et al. .................. 324/458 |
| 7,265,554 B2 * | 9/2007 | Ichimura et al. .................. 324/458 |
| 7,459,901 B2 * | 12/2008 | Barrault et al. .................. 324/133 |
| 7,554,331 B2 * | 6/2009 | Ichimura et al. .................. 324/458 |
| 7,576,546 B2 * | 8/2009 | Ichimura et al. .................. 324/458 |

(Continued)

FOREIGN PATENT DOCUMENTS

EP    1003044 B1 *  7/2008

(Continued)

*Primary Examiner*—Thomas Valone
(74) *Attorney, Agent, or Firm*—Canon USA Inc IP Div (57) ABSTRACT

An electric potential measuring apparatus including a substrate disposed facing a measurement object, a detecting electrode provided insulated from the substrate, and a capacity modulating unit for modulating a coupling capacity between the detecting electrode and the measurement object. In the electric potential measuring apparatus, a region with a dielectric constant less than a dielectric constant of the substrate is formed in the substrate to achieve an increase in resistivity of a portion of the substrate between detecting electrodes, or a decrease in a stray capacity between the detecting electrode and the substrate.

10 Claims, 10 Drawing Sheets

U.S. PATENT DOCUMENTS

2006/0267593 A1* 11/2006 Ichimura et al. ............ 324/452
2008/0129302 A1* 6/2008 Shafai et al. ................ 324/458

FOREIGN PATENT DOCUMENTS

| | | |
|---|---|---|
| JP | 58-211669 | 12/1983 |
| JP | 04-174541 | 6/1992 |
| JP | 2000-147035 | 5/2000 |
| JP | 2002-321358 | 11/2002 |
| JP | 2003-004683 | 1/2003 |
| JP | 2003-086676 | 3/2003 |

* cited by examiner

ELECTRIC POTENTIAL MEASURING APPARATUS, AND IMAGE FORMING APPARATUS

CROSS-REFERENCE TO RELATED APPLICATIONS

This application is a divisional of co-pending application Ser. No. 11/178,649 filed Jul. 11, 2005, which claims priority from Japanese Patent Applications No. 2004-204531, filed Jul. 12, 2004, and No. 2004-297017, filed Oct. 8, 2004, all of which are hereby incorporated by reference herein in their entirety.

BACKGROUND OF THE INVENTION

1. Field of the Invention

The present invention relates to an electric potential measuring apparatus capable of measuring an electric potential of an object to be measured (a measurement object) based on the amount of electrical charge induced in a detecting electrode, and an image forming apparatus including the electric potential measuring apparatus, applicable as a copying apparatus, a printer, and the like.

2. Description of the Related Background Art

Conventionally, there exists an image forming apparatus which includes a photosensitive drum and forms an image in an electrophotographic manner. In such an image forming apparatus, the photosensitive drum needs to be uniformly charged in any atmosphere so that a stable image can be obtained at all times. To achieve the above purpose, the charged electric potential of the photosensitive drum is measured by an electric potential measuring apparatus, and a feedback control is executed using the measured result to maintain a uniform electric potential of the photosensitive drum.

As an electric potential measuring apparatus usable for performing the feedback control, there has been developed an electric potential measuring apparatus capable of measuring an electric potential of a measurement object in a non-contacting manner in which any substantial member of the electric potential measuring apparatus is not in contact with a surface of the measurement object.

Description will be given for a potential measuring principle of the electric potential measuring apparatus. Upon generation of an electric field between a surface of a measurement object and a detecting electrode in an electric potential measuring apparatus, charges with an electric amount Q proportional to an electric potential V of the surface of the measurement object are induced in the detecting electrode. The relationship between Q and V is written by $$Q=CV \quad (1)$$

where C is the electrostatic capacity (capacitance) between the detecting electrode and the surface of the measurement object. Pursuant to equation (1), the electric potential of the surface of the measurement object can be obtained by measuring the electric amount Q of charges induced in the detecting electrode.

It is, however, difficult to accurately and directly measure the electric amount Q induced in the detecting electrode within a measurement time required by a copying apparatus, a printer, or the like. Accordingly, a practical method is used. In the practical method, the magnitude of the electrostatic capacity C between the detecting electrode and the surface of the measurement object is periodically changed, and the electric potential of the surface of the measurement object is obtained by measuring an AC current signal generated in the detecting electrode by the periodical change.

A principle of obtaining the electric potential of the surface of the measurement object by the above-discussed method will be described. When the electrostatic capacity C is a function of time t, the AC current signal i generated in the detecting electrode can be represented by $$i=dQ/dt=d(CV)/dt \quad (2)$$

since the AC current signal i is a value of a time derivative of the electric amount Q induced in the detecting electrode, and the equation (1) holds.

Where a changing speed of the electric potential V of the surface of the measurement object is sufficiently slow relative to a changing speed of the electrostatic capacity C, the equation (2) can be replaced by $$i=V \cdot dC/dt \quad (3)$$

since the electric potential V can be assumed to be constant during a short time dt.

From the equation (3), it can be understood that the magnitude of the AC current signal i generated in the detecting electrode is a linear function of the electric potential V of the surface of the measurement object. Therefore, the electric potential of a measurement object can be acquired by measuring the amplitude of an AC current signal.

As a method of periodically changing an electrostatic capacity C between a detecting electrode and a surface of a measurement object, there are typically three methods: (1) a method of periodically changing an effective area of the detecting electrode exposed to the surface of the measurement object, (2) a method of periodically changing a relative dielectric constant between the detecting electrode and the surface of the measurement object, and (3) a method of periodically changing a distance between the detecting electrode and the surface of the measurement object. This is because the electrostatic capacity C is approximated by the following equation (4), $$C=A \cdot S/x \quad (4)$$

where A is the proportional constant having connection with a dielectric constant of a material between the detecting electrode and the surface of the measurement object, and the like, S is the area of the detecting electrode, and x is the distance between the detecting electrode and the surface of the measurement object.

In a situation of the above-discussed conventional technology, the photosensitive drum is down-sized and a structure around the photosensitive drum becomes dense. Accordingly, reduction in size and thickness of an electric potential measuring apparatus is also required. In conventional electric potential measuring apparatuses, a space in the electric potential measuring apparatus is occupied almost by assemblage members of a vibrating cantilever, a driving mechanism for vibrating the cantilever, and the like. Therefore, small-sizing of those assemblage members is indispensable for purposes of reducing the size of the electric potential measuring apparatus.

However, when the driving mechanism and the like are reduced in size, the amount of change in the exposed area S of the detecting electrode, or in the distance x between the detecting electrode and the surface of the measurement object inevitably decreases. Here, from the above equations (3) and (4), the magnitude of a current taken out as an output signal from the above-discussed electric potential measuring apparatus is written as $$i = V \cdot d(A \cdot S/x)/dt \quad (5)$$

Therefore, when sizes of the driving mechanism and the like are to be decreased, a value of the time derivative in parentheses in the equation (5) becomes small. As a result, the current signal i of the output signal is likely to be affected by noise from outside, and a measurement precision disadvantageously lowers.

Considering those discussed above, a small-sized electric potential measuring apparatus produced using MEMS (micro-electro-mechanical system) techniques has been recently proposed (see U.S. Pat. No. 6,177,800). The MEMS techniques are techniques for fabricating a micro mechanical mechanism or electric device by utilizing semiconductor micro-processing techniques for large-scale integration and the like. By using the MEMS techniques, it is possible to mass-produce micro mechanical mechanisms integrated with electric devices, and the like, and largely reduce the size and cost of an electric potential measuring apparatus.

An advantage of a method of fabricating an electric potential measuring apparatus by the MEMS techniques is as follows. Reduction in the size and cost of an electric potential measuring apparatus can be achieved by fabricating, on a substrate, a small-sized driving mechanism, a detecting electrode, and a signal processing unit for processing a signal generated in the detecting electrode, which are component elements of the electric potential measuring apparatus. Semiconductor with an intentionally-enhanced carrier concentration is often used as the substrate such that electronic circuits for signal-processing and the like can be constructed on the substrate.

It is, however, known that resistivity of the semiconductor with a high carrier concentration is low. Therefore, when a material with a low resistivity is used as the substrate, it is likely that non-negligible stray capacity appears between the substrate, and the detecting electrode and electric wire formed on the substrate through an insulating thin film. Hence, almost all of AC signals generated in the detecting electrode or electric wire flow into another detecting electrode or electric wire through the stray capacity. This phenomenon occurs in all detecting electrodes and electric wires similarly. Therefore, an AC signal in a detecting electrode mixes with a driving signal for driving the driving mechanism, for example. Thus, measurement of an accurate electric potential value is likely to be prevented.

Difficulty of conduction of an AC signal with a frequency f between a detecting electrode or electric wire, and another detecting electrode or electric wire, i.e., an absolute value |Z| of impedance Z therebetween, is given by $$|Z| = \{(ar)^2 + [1/(2\pi f) \cdot (1/C_h + 1/C'_h)]^2\}^{1/2} \quad (6)$$

where $C_h$ is the stray capacity between a detecting electrode and the substrate, $C'_h$ is the stray capacity between another detecting electrode and the substrate, r is the resistivity of the substrate, and a is a proportional constant. It can be understood from the equation (6) that the absolute value |Z| of the impedance Z among detecting electrodes and electric wires should be increased in order to reduce or eliminate mixture of AC signals among detecting electrodes and electric wires. In other words, it is necessary to increase the resistivity r of a portion of the substrate between detecting electrodes, and/or to decrease the stray capacity $C_h$ between the detecting electrode and the substrate.

SUMMARY OF THE INVENTION

The present invention is directed to an electric potential measuring apparatus and an image forming apparatus including the electric potential measuring apparatus.

According to one aspect of the present invention, there is provided an electric potential measuring apparatus which includes a substrate to be disposed facing a measurement object, a detecting electrode provided on the surface of substrate and facing the measurement object, and a capacitance modulating unit configured to modulate a coupling capacitance between the detecting electrode and the measurement object. In the electric potential measuring apparatus, the substrate is composed of a material with a first dielectric constant. The substrate includes a region formed therein having an average value of a dielectric constant, which is less than the first dielectric constant.

According to another aspect of the present invention, there is provided an electric potential measuring apparatus which includes a substrate, an insulator, a plurality of detecting electrodes disposed on the substrate with the insulator therebetween, a capacitance modulating unit configured to modulate a coupling capacitance between the detecting electrodes and the measurement object, and a detecting unit configured to detect an electric potential of the measurement object based on a signal detected by the detecting electrodes. In the electric potential measuring apparatus, an insulator portion is formed in at least a portion of the substrate such that an electric impedance between the detecting electrodes is increased.

As the capacitance modulating unit, it is possible to use a construction in which a vibrating plate supported by at least a torsion bar in a swingingly-rotatable manner is vibrated relative to the measurement object such that a distance between the detecting electrode provided on the vibrating plate and the measurement object can be modulated, a construction in which a shutter with an opening is moved in a space between the measurement object and the detecting electrode provided on a fixed substrate such that an area of the detecting electrode exposed to the measurement object can be modulated, or the like.

According to another aspect of the present invention, there is provided an image forming apparatus which includes the above-described electric potential measuring apparatus of the present invention, and an image forming unit. In the image forming apparatus, a portion thereof with the detecting electrode is arranged facing an object surface to be measured in the image forming unit, and the image forming unit controls image formation based on a signal detected by the electric potential measuring apparatus. The image forming unit can have a function of copying, printing, facsimile, or the like. For example, the image forming unit includes a photosensitive drum rotatable about a predetermined axis, and is so constructed as to measure a charged potential of a surface of the photosensitive drum by using the electric potential measuring apparatus.

In an electric potential measuring apparatus of the present invention which includes a substrate to be disposed facing a measurement object, a detecting electrode provided under a condition insulated from the substrate, and a capacitance modulating unit configured to modulate a coupling capacitance between the detecting electrode and the measurement object, the stray capacitance appearing among detecting electrodes and electric wire can be reduced or eliminated, or the resistivity r of the substrate can be increased.

The features of the present invention will be more readily understood in connection with the following detailed description of the embodiments and examples of the invention in connection with the drawings.

DESCRIPTION OF THE EMBODIMENTS

Embodiments of an electric potential measuring apparatus and an image forming apparatus of the present invention will hereinafter be described with reference to the drawings.

Figure 1:
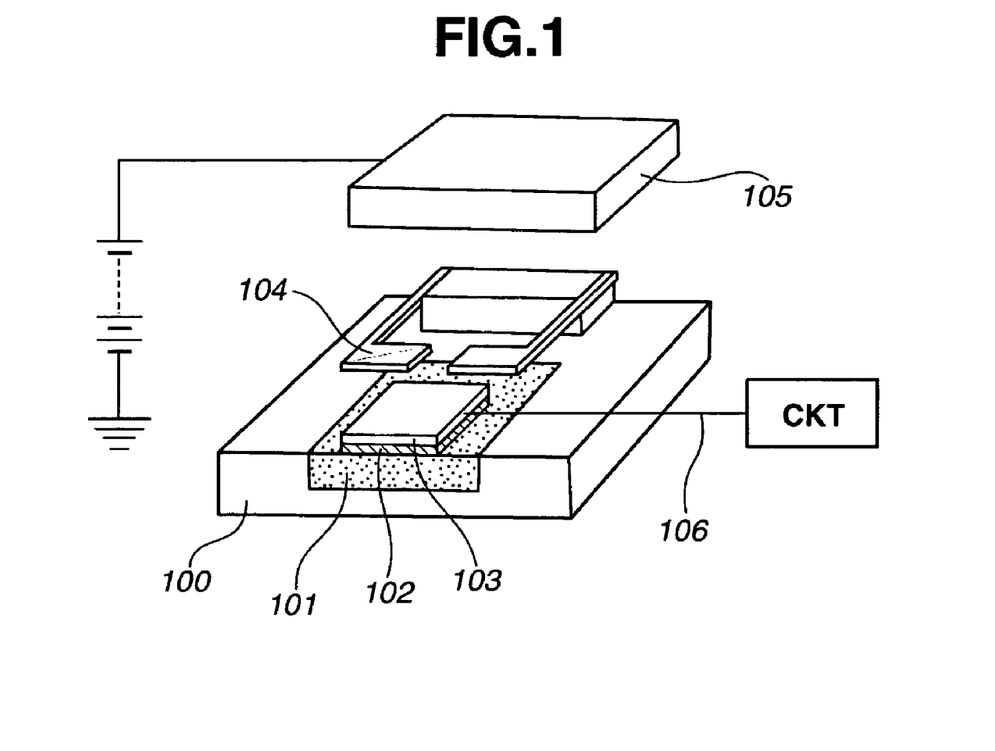
FIG. 1 is a perspective view illustrating an electric potential measuring apparatus of a first embodiment according to the present invention.
Figure 2:
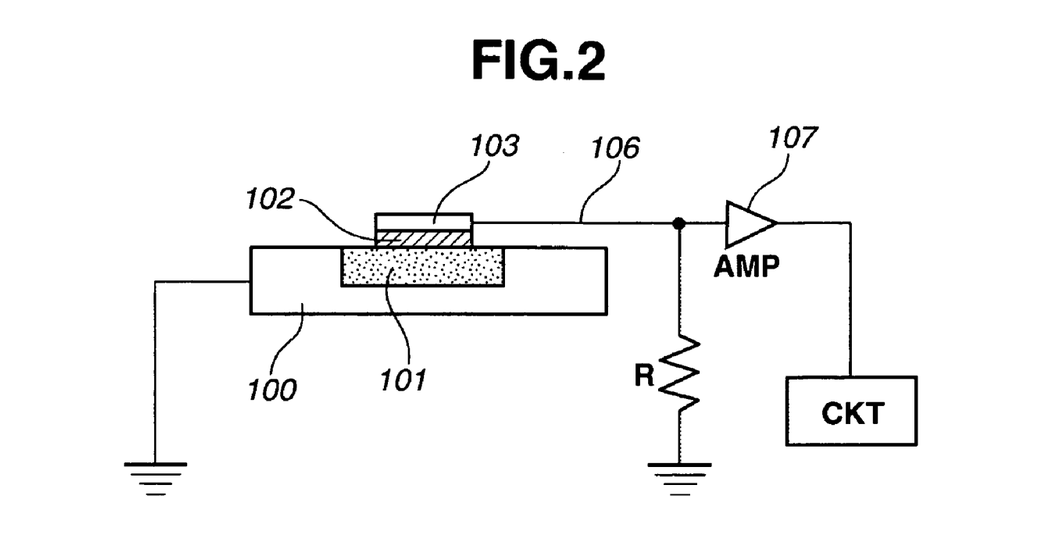
FIG. 2 is a cross-sectional view of the first embodiment.

A first embodiment directed to an electric potential measuring apparatus will be described with reference to FIGS. 1 and 2. As illustrated in FIGS. 1 and 2, a detecting electrode 103 for detecting a signal is disposed on a substrate 100 through an insulator layer 102. A measurement object 105 is placed above the detecting electrode 103, and a capacity (capacitance) modulating unit 104 for modulating the amount of charges induced in the detecting electrode 103 is provided in a space between the detecting electrode 103 and the measurement object 105.

The detecting electrode 103 for detecting a signal is connected to a signal detecting circuit (CKT) via an electric wire 106. A signal amplifier 107 for amplifying the signal supplied from the detecting electrode 103 is provided in the electric wire 106. A portion or region 101 with a reduced dielectric constant is formed in a portion of the substrate 100. Due to the presence of the region 101 with a reduced dielectric constant, it is possible to increase the resistivity r of a portion of the substrate between detecting electrodes, and/or to decrease the stray capacity (capacitance) $C_h$ between the detecting electrode and the substrate. Thus, a compact electric potential measuring apparatus with an improved performance can be achieved.

In this embodiment, the region 101 with a reduced dielectric constant is a region whose dielectric constant is less than the dielectric constant of the other portion of the substrate 100. For example, where the substrate 100 is a semiconductor substrate, the region 101 with a reduced dielectric constant can be composed of an insulator. More specifically, a silicon substrate with a dielectric constant of about 11.9 can be used as the semiconductor substrate, and a polyimide with a dielectric constant of about 3.2 can be used as the insulator.

A material of the region 101 is not limited to an insulator. It can be composed of whatever material or structure whose dielectric constant is less than that of the semiconductor substrate. The region 101 can be formed of a semiconductor material different from the semiconductor of the substrate 100, an oxide or nitride of a semiconductor material, an organic compound, a porous material, or the like.

The substrate 100 can be formed of a semiconductor, such as Si, GaAs, and GaN, but it can also be composed of an electrically-conductive material, depending on the structure of the apparatus. The insulator layer 102 can be composed of an oxide, such as $SiO_2$ and $Al_2O_3$, but it can also be an oxide film almost spontaneously formed on a surface of the semiconductor (such as Si) substrate. Further, the insulator layer 102 can be formed of a porous material of a nitride of Si, $SiO_2$, $Al_2O_3$, or the like, depending on the structure of the apparatus.

The detecting electrode 103 can be composed of whatever electrically-conductive material, such as Cu, Pt, Ag, Au, and Al. The capacity modulating unit can be a chopper for changing the area of a surface facing the measurement object 105, as illustrated in FIG. 1. The capacity modulating unit can also be a unit for changing the distance between the detecting electrode 103 and the measurement object 105.

The measurement object 105 can be composed of whatever material or component that has an electric potential. Specifically, it can be a photosensitive drum, or a paper on which an electric potential is generated by friction with a roller or the like. The electric wire 106 can be formed of anything that can supply a signal from the detecting electrode 103 to the signal detecting circuit (CKT). When the signal is small, the signal can be amplified by the signal amplifier 107.

Description will now be given for the principle of achieving a decrease in the stray capacity, or an increase in the resistivity r of the substrate owing to the above-discussed construction.

A stray capacity $C_h$ between a detecting electrode and a substrate is approximated by the following equation (7), $$C_h = \varepsilon_0 \cdot k_h \cdot S_h / d_h \quad (7)$$

where $k_h$ is the relative dielectric constant of a material between the detecting electrode and the substrate, $S_h$ is the area over which the detecting electrode directly faces the substrate, $d_h$ is the distance between the detecting electrode and the substrate, and $\in_0$ is the permittivity of vacuum.

From the equation (7), it can be seen that there are three methods to reduce the stray capacity $C_h$: (1) a method of reducing the relative dielectric constant $k_h$ of the insulator between the detecting electrode and the substrate, (2) a method of reducing the area $S_h$ over which the detecting electrode directly faces the substrate, and (3) a method of increasing the distance $d_h$ between the detecting electrode and the substrate. In the embodiment, the stray capacity $C_h$ between the detecting electrode and the substrate is decreased by a method in which a region with a dielectric constant less than that of the substrate is provided in a portion of the substrate such that the method (2) of reducing the area over which the detecting electrode directly faces the substrate, or the method (3) of increasing the distance between the detecting electrode and the substrate can be achieved.

Further, while the resistivity r of the substrate is determined by a material of the substrate, the resistivity of the entire substrate cannot be directly increased in the embodiment because the embodiment has the major premise that the substrate is formed of a material with a relatively small resistivity, such as a semiconductor with a relatively-high carrier concentration. However, when the structure of the substrate is subjected to appropriate means, it is possible to increase a resistance R which is undergone by an AC signal leaking from the detecting electrode into the substrate through the stray capacity $C_h$.

The resistance R experienced by the AC signal leaking into the substrate is given by $$R = r \cdot L_S/S_S \quad (8)$$

where $L_S$ is the length of a path P of an electric signal from a portion of the substrate directly beneath a detecting electrode to a portion of the substrate directly beneath another detecting electrode, and $S_S$ is the area of a cross section of the path P. It can be understood from the equation (8) that the following methods can be taken in order to increase the resistance R which is experienced by the AC signal leaking from the detecting electrode into the substrate through the stray capacity. Those methods are (1) a method of replacing a portion of the path P by an insulator portion to locally increase the resistivity of the path P, (2) a method of increasing the length $L_S$ of the path P, and (3) a method of reducing the area $S_S$ of the cross section of the path P. The embodiment selectively uses those methods.

A more specific structure of the first embodiment will now be described with reference to FIGS. 1 and 2. FIG. 2 illustrates a detailed structure of the substrate 100 in the electric potential measuring apparatus. The insulator layer or film 102 is formed between the substrate 100 and the detecting electrode 103. Directly under the insulator layer 102, there is provided a region 101 filled with an organic compound down to a predetermined depth, or a region whose dielectric constant is lowered. The organic compound is not exposed at a bottom surface of the substrate 100. Electric connection from the detecting electrode 103 is carried out as described above. The output of the signal amplifier 107 is synchronously detected by the signal detecting circuit (CKT) using a driving frequency of the chopper 104. In connection with the signal detecting circuit, an integrated circuit can be constructed on the substrate 100 when a semiconductor substrate, on which an integrated circuit can be formed, is used as a main material of the substrate 100. Such an integral configuration on the substrate can achieve a smaller construction.

The dielectric constant $e_2$ (more accurately, an average value of the dielectric constant per unit volume) of the organic compound in the region 101 is smaller than the dielectric constant $e_1$ of the semiconductor substrate 100. Accordingly, the stray capacity created by the detecting electrode 103 disposed on the region 101 is made smaller than that in a case where the region 101 is a semiconductor substrate itself. As a result, a reduction in the impedance between the detecting electrode 101 and the ground can be oppressed.

A fabrication method of the above structure will be described. A silicon is used as the semiconductor substrate 100. A hole is formed in a portion of the Si substrate corresponding to a portion directly beneath the detecting electrode 103 to be formed thereafter, by using wet etching or dry etching. The hole is then filled with a polyimide of an organic material, and the polyimide is hardened. The region 101 with a reduced dielectric constant is thus formed. Further, insulator layer 102 and detecting electrode 103 are formed on a surface of the region 101. The construction as illustrated in FIGS. 1 and 2 is thus fabricated.

The dielectric constant of the polyimide is about 3.2, while the dielectric constant of the silicon is about 11.9. Accordingly it is possible to reduce the stray capacitor created by the detecting electrode 103 on the region 101. Alternatively, $SiO_2$ can be formed in the region 101 by oxidizing a portion of the silicon substrate.

The operation of the above construction is carried out in the following manner. Electric lines of force emitted from the measurement object 105 are modulated by the vibration of the chopper functioning as the capacity modulating unit 104. The detecting electrode 103 detects the modulated electric lines of force. The amount of charges induced in the detecting electrode 103 is modulated by the electric lines of force, and a small AC current is generated from the detecting electrode 103. The AC current is converted into a voltage by a large resistor connected to the ground. A signal of the voltage amplified by the signal amplifier 107 is used for measurement of the electric potential of the measurement object 105.

Figure 3:
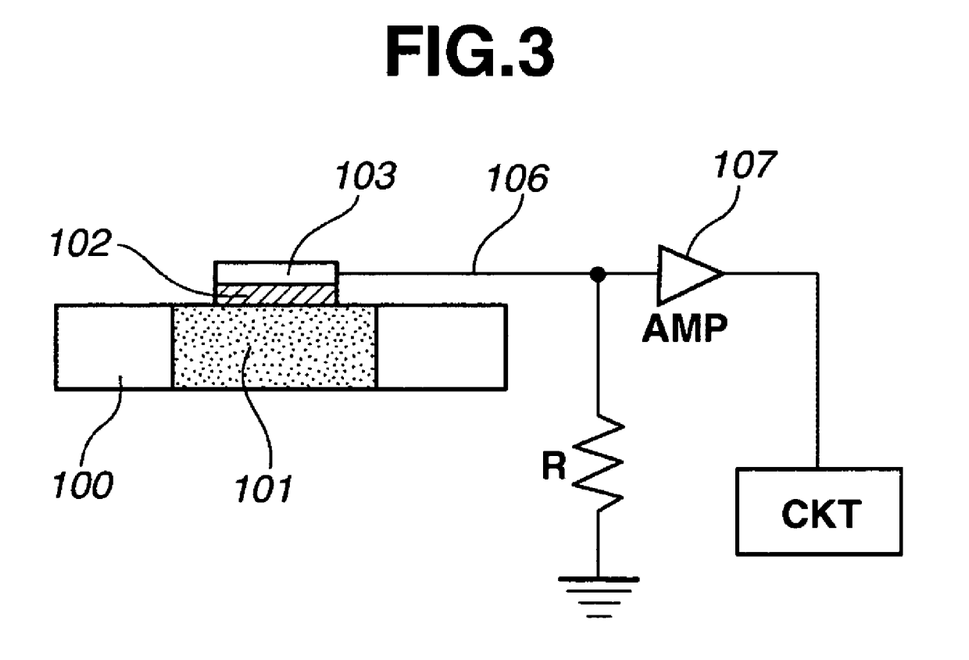
FIG. 3 is a cross-sectional view illustrating an electric potential measuring apparatus of a second embodiment according to the present invention.

A second embodiment of the present invention will now be described with reference to FIG. 3. In the second embodiment, the region 101 directly under the detecting electrode 103 and the insulator layer 102 in the semiconductor substrate 100 reaches a bottom surface of the substrate 100. The region 101 is composed of a porous structure. In this case, a volumetric average value $\in_2 A$ of the dielectric constant of the region 101 is given by $$\in_2 A = \in_1 \cdot P \quad (9)$$

where $\in_1$ is the dielectric constant of the semiconductor substrate 100, and P is the packed ratio of the region 101. The packed ratio P is defined by a ratio of a volume of a material portion, where the material exists in the porous structure, relative to the total volume of the region 101 including the material portion and a vacant portion.

Here, P is less than 1 (one), and therefore $\in_2 A$ is smaller than $\in_1$. Accordingly, the value of the stray capacity associated with the detecting electrode 103 can be advantageously reduced.

A fabrication method of the above structure will be described. A silicon wafer is prepared as the semiconductor substrate. A first portion of the semiconductor substrate other than a second portion corresponding to the region 101 is covered such that the first portion will not be influenced by anodic oxidation. The second portion of the semiconductor substrate is then subjected to the anodic oxidation to form the region 101 of the porous structure. After the anodic oxidation, the insulator layer 102 and the detecting electrode 103 are formed on the region 101 of the porous structure.

Thus, the fabrication of an electric potential measuring apparatus is achieved. The construction as illustrated in FIG. 3 can be obtained by the anodic oxidation performed to a desired portion of the substrate. Anodic oxidation can be carried out from upper and lower surfaces of the substrate to effectively fabricate the apparatus. The operation of the second embodiment is substantially the same as that of the first embodiment.

A third embodiment of the present invention will now be described with reference to FIGS. 4A to 4C. The distance between a measurement object and a detecting electrode is modulated in the third embodiment, while the number of electric lines of force reaching the detecting electrode is modulated (i.e., S in the above equation (5) is modulated) by the chopper in the first and second embodiments. As can be understood from the equation (5), the coupling capacity can also be changed by modulating the distance x.

Figure 4A:
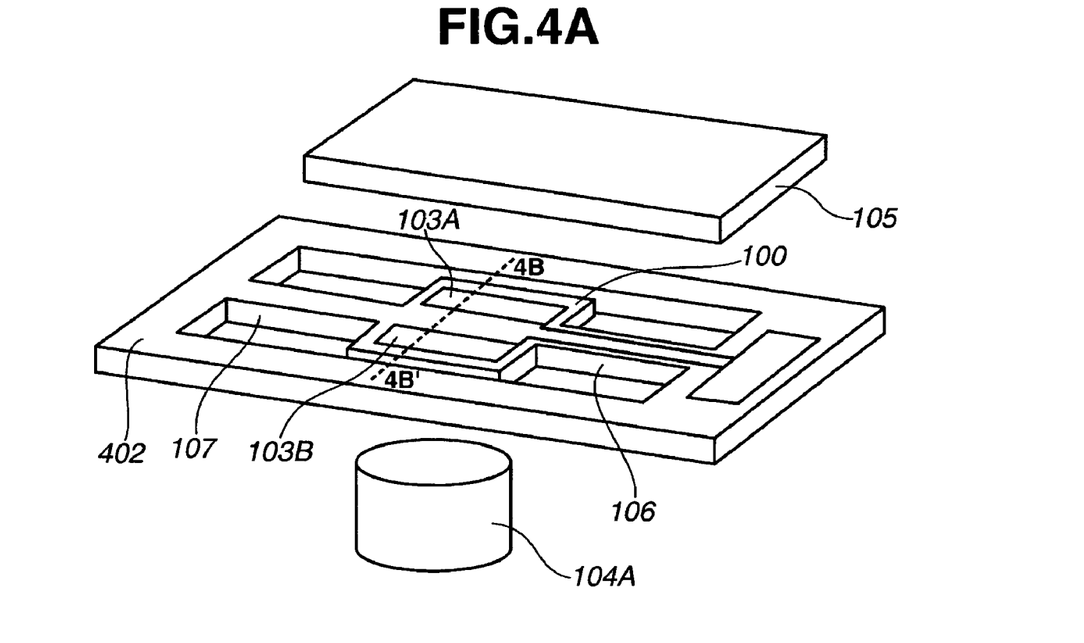
FIG. 4A is a perspective view illustrating an electric potential measuring apparatus of a third embodiment according to the present invention.
Figure 4B:
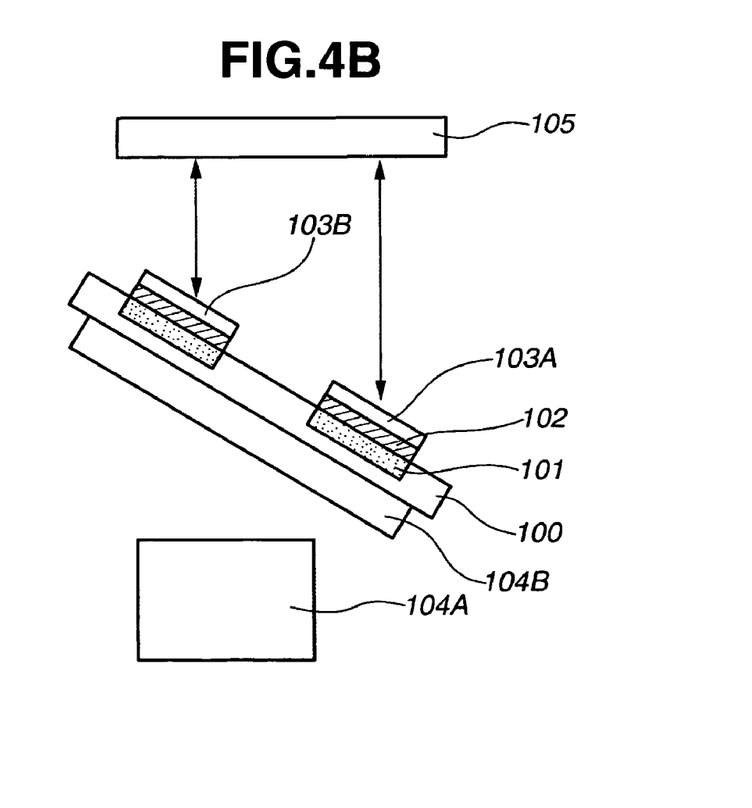
FIG. 4B is a cross-sectional view of the third embodiment, taken along line 4B-4B' of FIG. 4A.
Figure 4C:
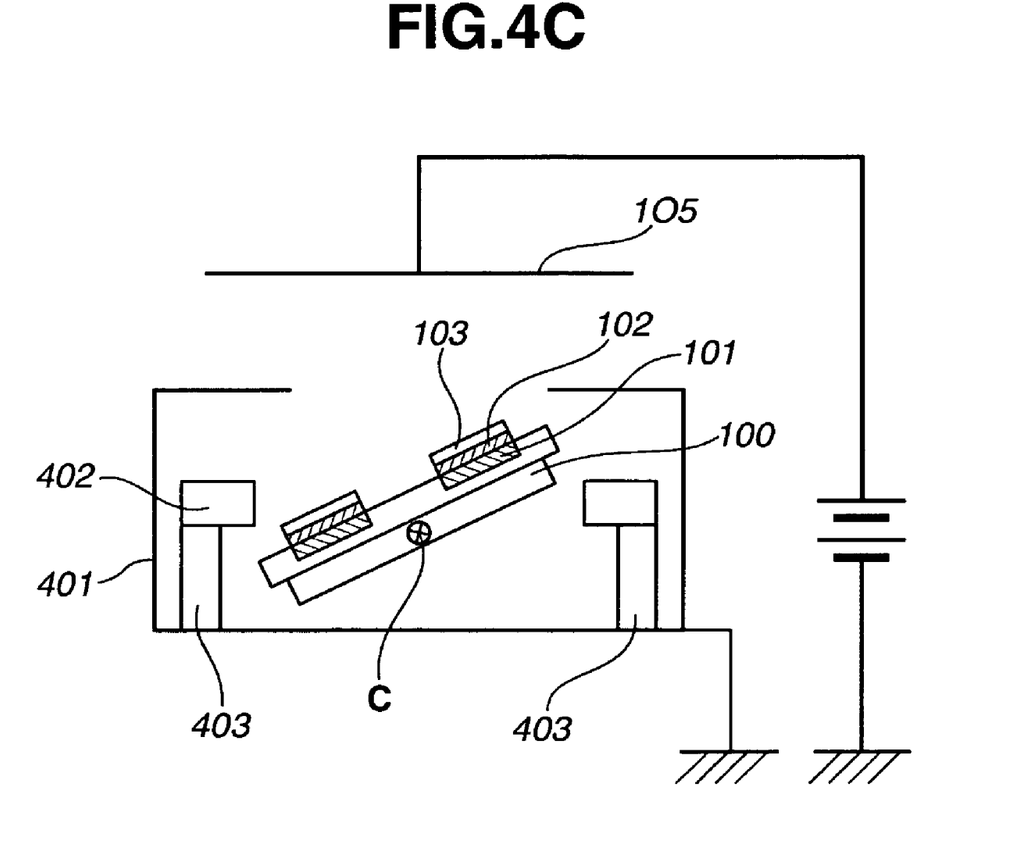
FIG. 4C is another cross-sectional view of the third embodiment.

FIG. 4C schematically shows the entire structure of an electric potential measuring apparatus of the third embodiment. In FIG. 4C, the electric potential measuring apparatus is disposed facing a measurement object 105. Reference numeral 401 designates a case for encasing the electric potential measuring apparatus. The case 401 covers an upper portion of a swinging member 100 except a portion of detecting electrodes 103. The case 401 is formed of an electrically-conductive material, and connected to the ground. A supporting substrate 402 for rotatably supporting the swinging member 100 is fixed to the case 401 by an appropriate installing jig 403. The presence of the thus-arranged case 401 makes it possible that only electric lines of force from a portion of the measurement object 105 approximately directly facing the swinging member 100 reach the detecting electrodes 103. Thus, noise components can be oppressed, and highly precise measurement of an electric potential of the measurement object 105 can be ensured.

Further, an opening is formed in a central portion of the supporting substrate 402, and the planar swinging member 100 is rotatably supported in this opening. The swinging member is supported in a swingingly-rotatable manner about a center axis C by a couple of torsion bars (front side and rear side) extending perpendicularly to the sheet of FIG. 4C. The swinging member 100 and the supporting substrate 402 are formed of a semiconductor material.

On an upper surface of the swinging member 100, two planar detecting electrodes 103 with the same shape are disposed symmetrically with respect to the center axis C. Electric wires for the detecting electrodes 103 are formed on the swinging member 100, the torsion bar and the supporting substrate 402 (see FIG. 4A). A region 101 with a reduced dielectric constant is formed under each detecting electrode 103. The region 101 has the above-described construction.

When the swinging member 100 is swingingly rotated about the center axis C, the two detecting electrodes 103 on the swinging member 100 periodically go close to or away from the measurement object 105 in a mutually-opposite phase. Accordingly, it is possible to differentially amplify modulated current signals from the detecting electrodes 103. Each detecting electrode 103 is electrically connected to a pull-out electrode (not shown) formed on the supporting substrate 402 via the electric wire formed on the torsion bar. For example, the detecting electrodes 103 are electrically connected to inverting and non-inverting input contacts of a differential amplifier disposed externally of the supporting substrate 402, respectively. Thus, modulated currents from the detecting electrodes 103 are differentially amplified, and synchronously detected by the detecting circuit, similar to the first embodiment.

Only one detecting electrode can be provided on the swinging member 100 (i.e., one of the detecting electrodes 103 is removed in the structure of FIG. 4C) In this case, the modulated current from the detecting electrode does not undergo the differential amplification, and is instead detected as described in the first and second embodiments.

In the electric potential measuring apparatus of the third embodiment, the swinging member 100 can be periodically swung about the center axis C defined by the torsion bar, by appropriately selecting a swinging-member driving mechanism, shapes and materials of the swinging member 100 and the torsion bar, and the like. The swinging-member driving mechanism includes a magnet provided on a bottom surface of the swinging member 100, and an external coil which generates magnetic fields when an AC current is caused to flow therein. The construction of the swinging-member driving mechanism is not limited to that electromagnetic type. A driving mechanism of an electrostatic or piezoelectric type can also be used.

FIG. 4A is a perspective view illustrating the above-discussed construction viewed from another angle of view. FIG. 4B is a cross-sectional view, taken along line 4B-4B' of FIG. 4A. In the swinging member 100, an insulator portion 101 or the region 101 is formed at a portion under each of the detecting electrodes 103A and 103B through the insulator layer 102, extending in a direction of thickness of the swinging member 100. Due to such a construction, it is possible to reduce an area, over which the detecting electrodes 103A and 103B directly face a surface of the swinging member 100, to about zero (0). Therefore, as can be understood from the equation (7), the stray capacity between the detecting electrodes 103A and 103B and the swinging member 100 can be largely reduced, as compared with a case where the detecting electrode 103 is provided on the swinging member 100 only through the insulator layer 102.

Further, an electric path between the detecting electrodes 103A and 103B is almost intercepted in the third embodiment. Hence, the resistance R in the equation (8) increases largely. As a result, the impedance in the equation (6) between the detecting electrodes 103A and 103B can be largely increased. It is thus possible to prevent or minimize the phenomenon of mixture of AC signals between the detecting electrodes 103A and 103B. Therefore, relatively-accurate electric potential signals can be obtained even if the swinging member 100 of a semiconductor with a relatively low resistivity, or of an electric conductor is used. In the third embodiment, the insulator layer 102 can be omitted if fabrication of such a structure is possible, since the insulator portion 101 is formed under each of the detecting electrodes 103A and 103B.

Figure 5A:
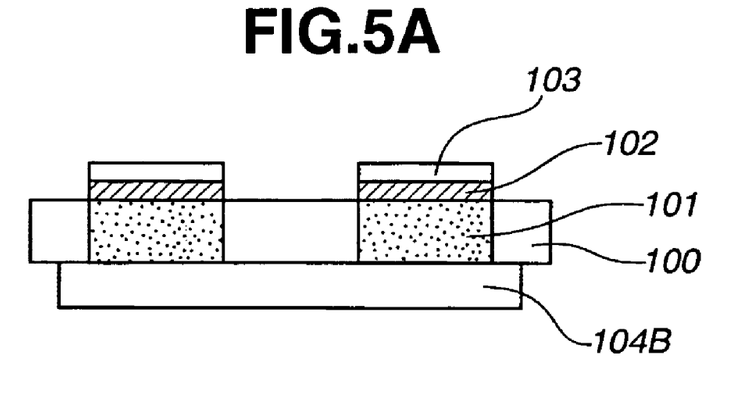
FIGS. 5A to 5C are cross-sectional views illustrating various arrangements of portions with a reduced dielectric constant in a substrate of the third embodiment according to the present invention, respectively.

In the embodiment of FIGS. 4A to 4C, the insulator portion 101 is formed halfway in the direction of thickness of the swinging member 100. However, it is also possible to adopt a structure of FIG. 5A in which an insulator portion 101 is formed throughout the thickness of a swinging member 100. As the thickness of the insulator portion 101 in the swinging member 100 increases, the impedance between the detecting electrodes 103A and 103B increases. Accordingly, the phenomenon of mixture of AC signals between the detecting electrodes 103A and 103B can be prevented or minimized to a greater extent, and an electric potential measurement signal can be obtained with more accuracy. Also in the structure of FIG. 5A, the insulator layer 102 can be omitted if fabrication of such a structure is possible, since the insulator portion 101 is formed under each of the detecting electrodes 103A and 103B.

Figure 5B:
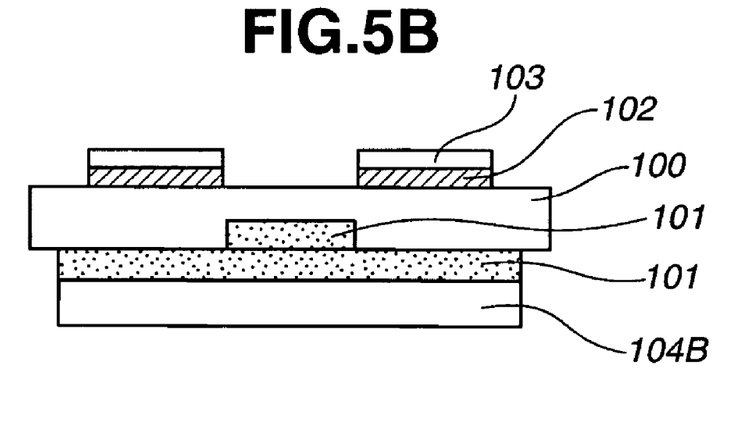
Figure 5C:
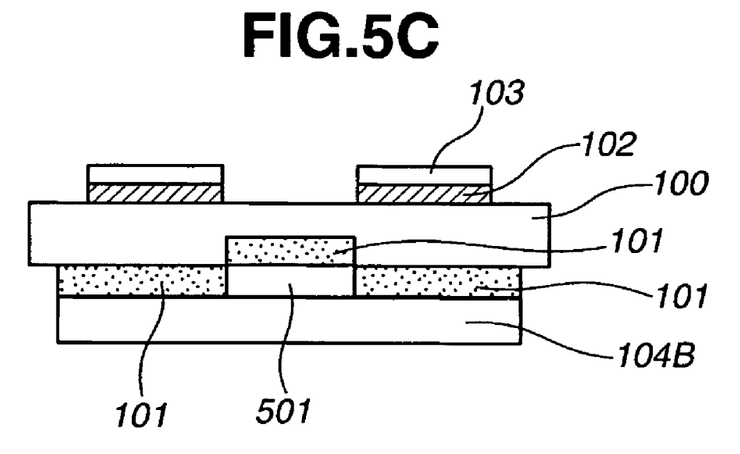

Further, it is possible to adopt the structures of FIGS. 5B and 5C in which an insulator portion 101 is formed halfway in the direction of thickness of the swinging member 100 from a bottom surface of the swinging member 100 opposite to the side of the detecting electrodes 103. Also in such structures, the impedance between the detecting electrodes 103A and 103B can be increased. In those structures of FIGS. 5B and 5C, an insulator portion 101 is interposed between the swinging substrate 100 and the magnet 104B to intercept an electric path through the magnet 104B which has an electric conductivity. Further, the insulation can be increased more greatly by providing a space 501 under the insulator portion 101 formed in the swinging member 100, as illustrated in FIG. 5C.

Figure 6A:
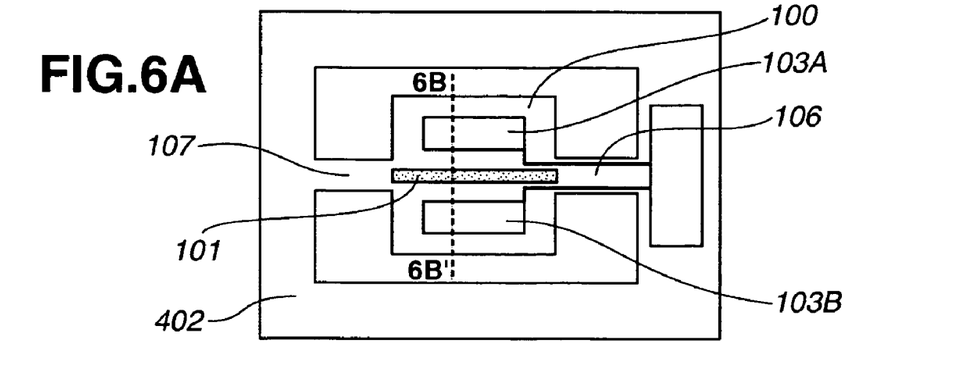
FIG. 6A is a plan view illustrating an electric potential measuring apparatus of a fourth embodiment according to the present invention.
Figure 6B:
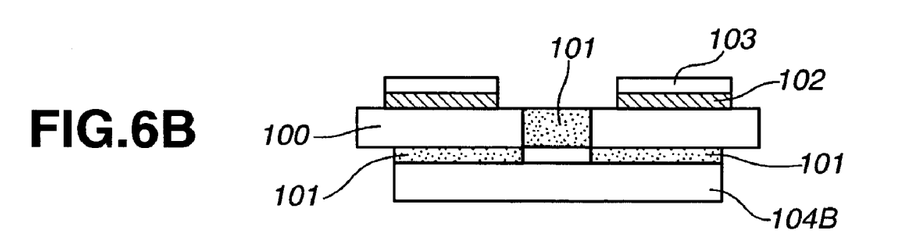
FIGS. 6B to 6E are cross-sectional views, taken along line 6B-6B' of FIG. 6A, illustrating various arrangements of insulator portions in a substrate of the fourth embodiment, respectively.

A fourth embodiment of the present invention will now be described with reference to FIGS. 6A and 6B. FIG. 6B is a cross-sectional view, taken along line 6B-6B' of FIG. 6A which is a plan view. In an electric potential measuring apparatus of the fourth embodiment, an insulator portion 101 is formed in a portion of a swinging member 100 between detecting electrodes 103A and 103B to increase the resistance of the swinging member 100. The insulator portion 101 is formed in a portion of the swinging member 100 between the detecting electrodes 103A and 103B throughout the direction of thickness of the swinging member 100, and a permanent magnet 104a is provided on a bottom surface of the swinging member 100 through an insulator layer 101. Since the permanent magnet 104a also has an electric conductivity, the insulator portion 101 formed on the bottom surface is necessary to intercept an electric path through the permanent magnet 104a.

Figure 6C:
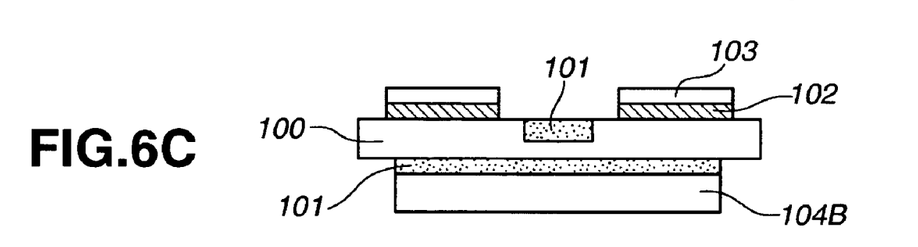

In such a structure, the length of an electric path from the detecting electrode 103A to the detecting electrode 103B becomes longer by the length of a path through torsion bars 106 and 107. Therefore, it can be seen from the equation (8) that the resistance from the detecting electrode 103A to the detecting electrode 103B can be made longer than that in a case where no insulator portion is provided. As a result, the impedance between the detecting electrodes 103A and 103B can be largely increased. It is thus possible to prevent or minimize the phenomenon of mixture of AC signals between the detecting electrodes 103A and 103B, and obtain an electric potential measurement signal with relatively-high accuracy.

Where it is difficult to form the insulator portion 101 throughout the direction of thickness of the swinging member 100 as illustrated in FIG. 6B, it is possible to form an insulator portion 101 halfway in the direction of thickness of the swinging member 100 from a surface of the swinging member 100, on which the detecting electrodes 103A and 103B are disposed, as illustrated in FIG. 6C.

Figure 6D:
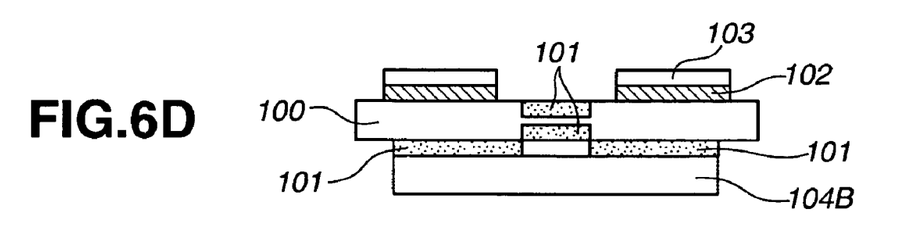
Figure 6E:
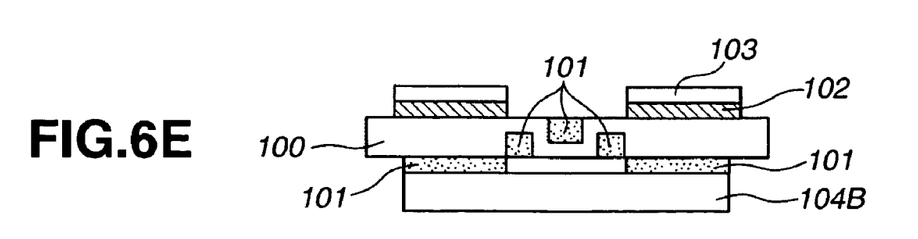

Further, it is possible to form insulator portions 101 halfway in the direction of thickness of the swinging member 100 from a surface of the swinging member 100, on which the detecting electrodes 103A and 103B are disposed, and from its surface opposite thereto, as illustrated in FIGS. 6D and 6E, respectively. In those structures of FIGS. 6D and 6E, the width of a low-resistance region becomes narrow in a portion where the insulator portions 101 are formed, so that the resistance in the equation (8) in a portion of the swinging member 100 between the detecting electrodes 103A and 103B increases.

In the construction of FIG. 6C, the impedance between the detecting electrodes 103A and 103B can be increased more as the insulator portion 101 becomes deeper. In the construction of FIG. 6E, the insulator portions 101 are formed in a zigzag manner. Accordingly, a low-resistance region thereat can be narrowed, and elongated. Thus, a value of the resistance in the equation (8) in a portion of the swinging member 100 between the detecting electrodes 103A and 103B can be further increased.

Figure 7A:
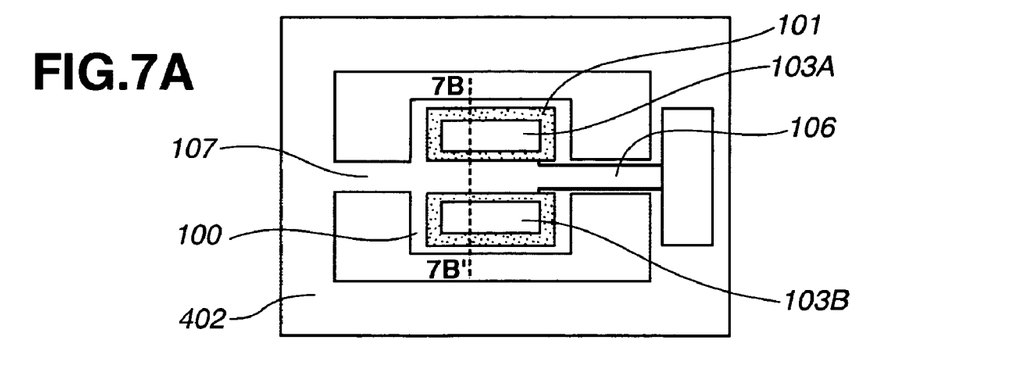
FIG. 7A is a plan view illustrating an electric potential measuring apparatus of a fifth embodiment according to the present invention.
Figure 7B:
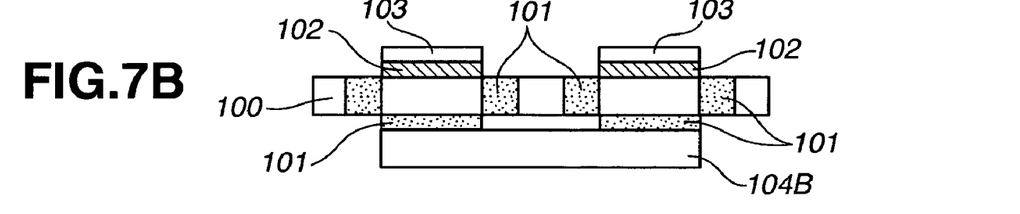
FIGS. 7B to 7D are cross-sectional views, taken along line 7B-7B' of FIG. 7A, illustrating various arrangements of insulator portions in a substrate of the fifth embodiment, respectively.
Figure 7C:
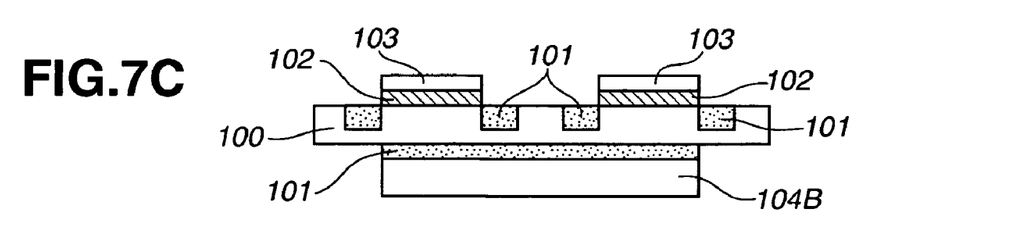
Figure 7D:
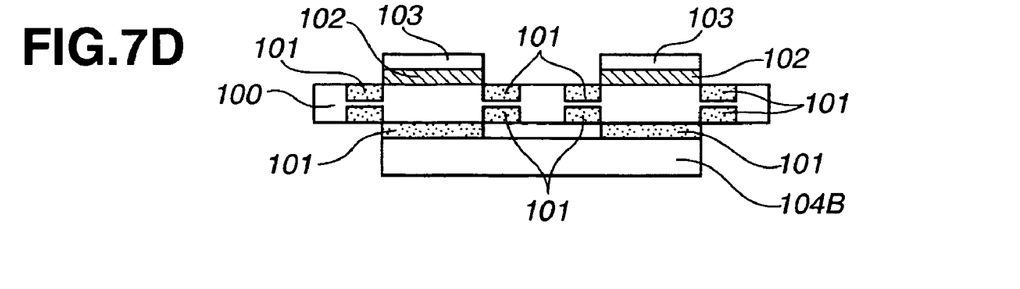
Figure 8A:
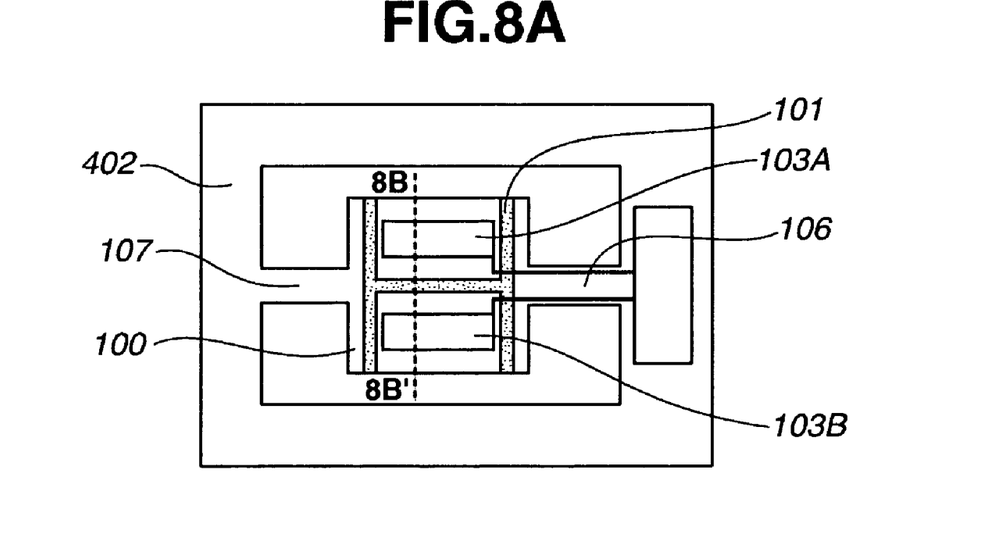
FIG. 8A is a plan view illustrating an electric potential measuring apparatus of a modification of the fifth embodiment according to the present invention.
Figure 8B:
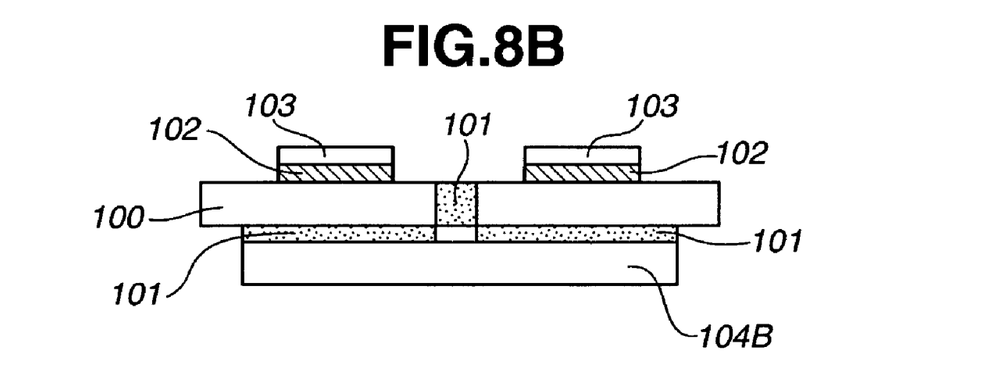
FIGS. 8B and 8C are cross-sectional views, taken along line 8B-8B' of FIG. 8A, illustrating various arrangements of insulator portions in a substrate of the modification of the fifth embodiment, respectively.
Figure 8C:
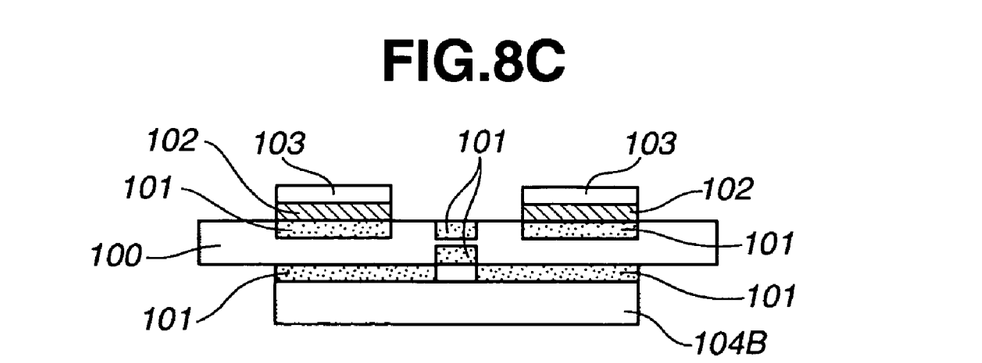

A fifth embodiment of the present invention will now be described with reference to FIGS. 7A and 7B, and FIGS. 8A and 8B. FIGS. 7B and 8B are cross-sectional views, taken along line 7B-7B' and line 8B-8B' of FIG. 7A and FIG. 8A, which are plan views, respectively. In an electric potential measuring apparatus of the fifth embodiment, an insulator portion 101 is formed surrounding each of detecting electrodes 103A and 103B, viewed from above, and extends throughout the direction of thickness of the swinging member 100. In such a structure, an electric path in the swinging member 100 between the detecting electrodes 103A and 103B can be insulated on its halfway, and the impedance between the detecting electrodes 103A and 103B can be largely increased. Also in those structures, the permanent magnet 104B is provided on a bottom surface of the swinging member 100 through an insulator portion 101 for the above-described reason.

Where it is difficult to form the insulator portion 101 throughout the direction of thickness of the swinging member 100 as illustrated in FIG. 7B or 8B, it is possible to form an insulator portion 101 halfway in the direction of thickness of the swinging member 100, as illustrated in FIGS. 7C and 7D, and FIG. 8C. In those structures of FIGS. 7C and 7D, and FIG. 8C, an electric path in the swinging member 100 between the detecting electrodes 103A and 103B can be narrowed, and elongated. Thus, a value of the resistance in the equation (8) in a portion of the swinging member 100 between the detecting electrodes 103A and 103B can be increased.

Further, in the construction illustrated in FIG. 8C, there are provided a structure for reducing the stray capacity between the swinging member 100 and the detecting electrodes 103A and 103B, and a structure for increasing a value of the resistance of the electric path between the detecting electrodes 103A and 103B through the swinging member 100, the torsion bars 106 and 107, and the supporting member 402. Due to functions of those structures, the stray capacity and the like can be more effectively reduced, and noise can be effectively lowered.

Figure 9A:
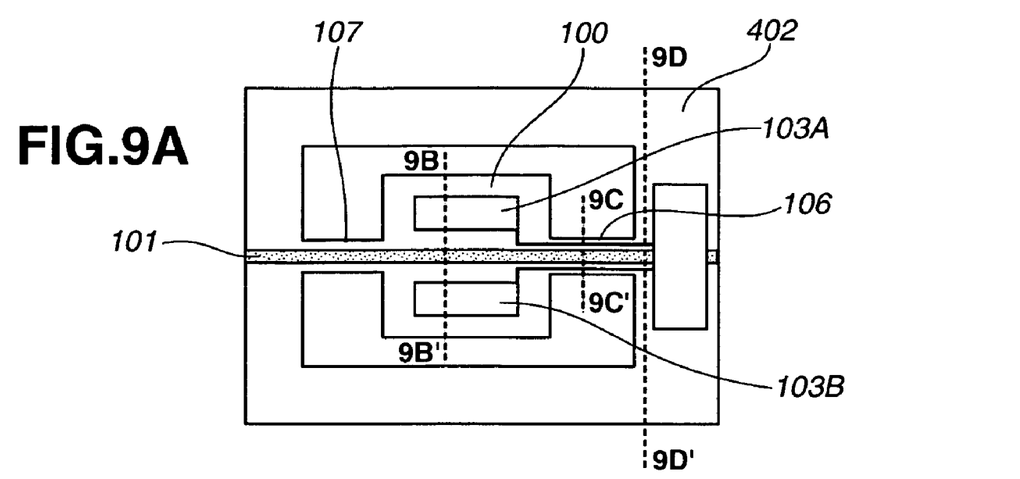
FIG. 9A is a plan view illustrating an electric potential measuring apparatus of a sixth embodiment according to the present invention.
Figure 9B:
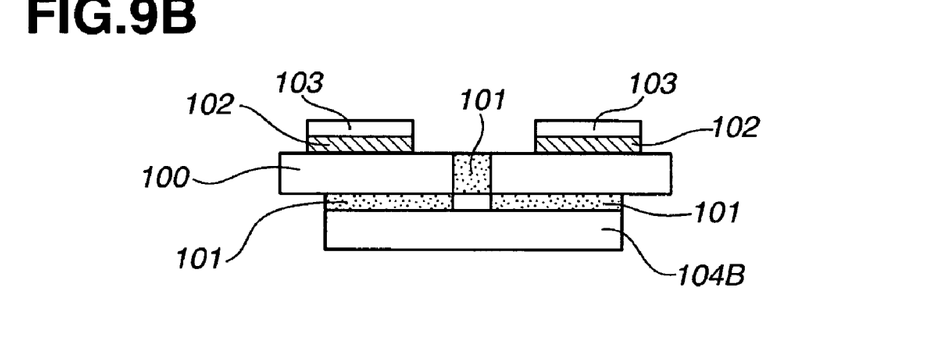
FIGS. 9B to 9D are cross-sectional views, taken along line 9B-9B' of FIG. 9A, respectively.
Figure 9C:
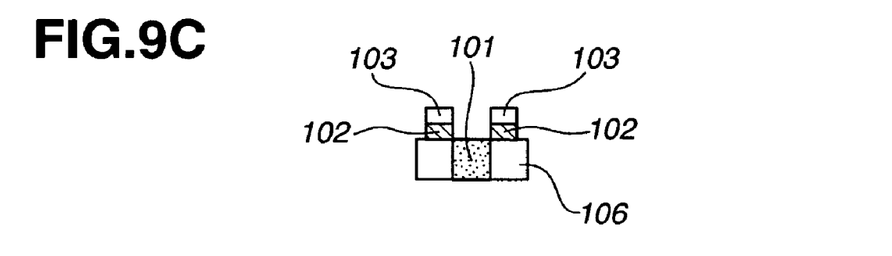
Figure 9D:
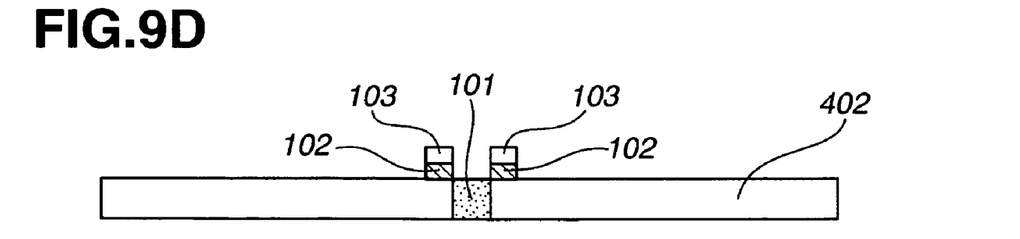

A sixth embodiment of the present invention will now be described with reference to FIGS. 9A to 9D. FIGS. 9B to 9D are cross-sectional views, taken along lines 9B-9B', 9C-9C', and 9D-9D' of FIG. 9A which is a plan view, respectively. In an electric potential measuring apparatus of the sixth embodiment, an insulator portion 101 is formed extending over all of a swinging member 100, torsion bars 106 and 107, and a supporting member 402. In such a structure, it is possible to increase a value of the resistance of an electric path from a detecting electrode 103A to a detecting electrode 103B through the torsion bars 106 and 107, and the supporting member 402. Thus, the impedance between the detecting electrodes 103A and 103B can be increased.

In each of the swinging member 100, the torsion bars 106 and 107, and the supporting member 402, the configuration of the insulator portion can be selected from any one of configurations described in the third, fourth and fifth embodiments. In the construction of the sixth embodiment, the insulator portion 101 is formed extending throughout the direction of thickness of the swinging member 100, the torsion bars 106 and 107, and the supporting member 402, as illustrated in FIGS. 9B to 9D. Therefore, a value of the resistance of the electric path from underneath the detecting electrode 103A to the detecting electrode 103B can be largely increased.

Figure 10:
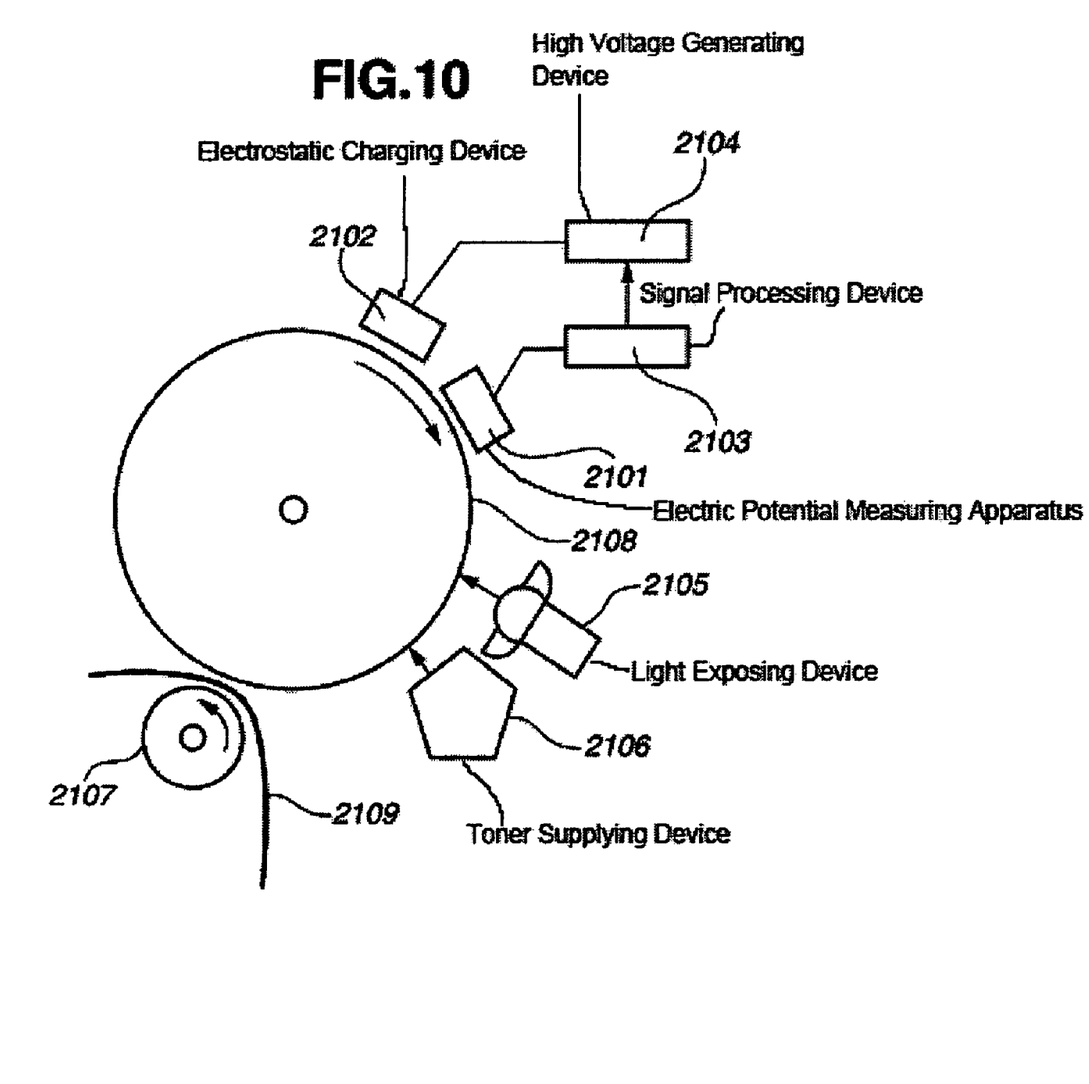
FIG. 10 is a view schematically illustrating a seventh embodiment of an image forming apparatus according to the present invention.

Description will now be given for an image forming apparatus of a seventh embodiment using an electric potential measuring apparatus of the present invention, with reference to FIG. 10. In FIG. 10, reference numeral 2101 designates an electric potential measuring apparatus of the present invention. Reference numeral 2102 designates an electrostatic charging device. Reference numeral 2103 designates a signal processing device. Reference numeral 2104 designates a high-voltage generating device. Reference numeral 2105 designates a light exposing device. Reference numeral 2106 designates a toner supplying device. Reference numeral 2107 designates a transferring material conveying roller. Reference numeral 2108 designates a photosensitive drum. Reference numeral 2109 designates a transferring material sandwiched between the transferring material conveying roller 2107 and the photosensitive drum 2108.

An electric potential distribution on the photosensitive drum 2108 can be measured when an output of the potential measuring apparatus 2101 is monitored in synchronism with the rotation of the photosensitive drum 2108. Unevenness of an image can be reduced when the electrostatic charging device 2102 is controlled based on the thus-measured electric potential distribution.

As illustrated in FIG. 10, the electrostatic charging device 2102, the electric potential measuring apparatus 2101, the light exposing device 2105, and the toner supplying device 2106 are arranged around the photosensitive drum 2108. The electrostatic charging device 2102 electrifies a surface of the drum 2108, and the surface of the drum 2108 is exposed to light using the exposing device 2105 to form a latent image on the drum 2108. Toner is attached to the latent image by the toner supplying device 2106 to obtain a toner image. The toner image is then transferred to the transferring material 2109 sandwiched between the transferring material conveying roller 2107 and the photosensitive drum 2108, and the toner on the transferring material 2109 is fixed. Image formation is achieved by executing those process steps.

In the above-discussed structure, a charged condition of the drum 2108 is measured by the electric potential measuring apparatus 2101 capable of outputting an accurate signal with reduced noise, its signal is processed by the signal processing device 2103, and the electrostatic charging device 2102 is controlled by feeding the processed signal back to the high-voltage generating device 2104. Thus, a stable electrical charging of the drum 2108 is achieved such that a stable image formation can be obtained.

Except as otherwise disclosed herein, the various components shown in outline or in block form in the figures are individually well-known and their internal construction and operation are not critical either to the making or using of the present invention or to a description of the beast mode of the invention.

While the present invention has been described with respect to what is presently considered to be the embodiments and examples, it is to be understood that the invention is not limited to the disclosed embodiments and examples. The present invention is intended to cover various modifications and equivalent arrangements included within the spirit and the scope of the appended claims.

This application claims priority from Japanese Patent Applications No. 2004-204531, filed Jul. 12, 2004, and No. 2004-297017, filed Oct. 8, 2004, the contents of which are hereby incorporated by reference.

What is claimed is:

1. An electric potential measuring apparatus operable to measure an electric potential of a measurement object, comprising:
a substrate formed of a semiconductor material;
an insulator layer;
a plurality of detecting electrodes provided on the substrate with the insulator layer therebetween using MEMS techniques;
a capacitance modulating unit configured to modulate a coupling capacitance between the detecting electrodes and the measurement object;
a detecting unit configured to detect an electric potential of the measurement object based on a signal detected by the detecting electrodes; and
an insulator portion formed in at least a portion of the substrate,
wherein the insulator portion is provided at least one of a position where a length of an electric path between the detecting electrodes that is created in the substrate through a stray capacitance caused in the insulator layer is elongated, a position where the electric path is narrowed in a thickness direction of the substrate, and a position where the electric path is insulated.

2. An electric potential measuring apparatus according to claim 1, wherein the insulator portion is formed in at least the portion of the substrate under the detecting electrodes.

3. An electric potential measuring apparatus according to claim 1, wherein the insulator portion is formed in the portion of the substrate which is not under the detecting electrodes, and which is between the detecting electrodes.

4. An electric potential measuring apparatus according to claim 1, wherein the insulator portion is formed in the portion of the substrate which is under the detecting electrodes, and which is between the detecting electrodes.

5. An electric potential measuring apparatus according to claim 1, wherein the insulator portion is formed throughout a thickness of the substrate.

6. An electric potential measuring apparatus according to claim 1, wherein the insulator portion is formed substantially halfway in a direction of thickness of the substrate.

7. An image forming apparatus comprising:
the electric potential measuring apparatus according to claim 1;
an image forming unit; and
the electric potential measuring apparatus including an upper surface, on which the detecting electrodes are disposed, arranged facing the measurement object of the image forming unit,
wherein the image forming unit control image formation based on a signal detected by the electric potential measuring apparatus.

8. An electric potential measuring apparatus according to claim 1, wherein the substrate is formed of one of Si, Ge, GaAs, and GaN.

9. An electric potential measuring apparatus according to claim 1, wherein the insulator formed between the substrate and the electrodes is formed of one of $SiO_2$, $Si3N4$, $HfO2$, $Al_2O_3$, $SiO2 \rightarrow SiOx$ ($0<x\leq2.0$), $Al2O3 \rightarrow AlOy$ ($0<y\leq1.5$), $Si3N4 \rightarrow SiNz$ ($0<z<4/3$), and $HfO2 \rightarrow HfOx$ ($0<x\leq2.0$).

10. An electric potential measuring apparatus according to claim 1, wherein the electrodes are formed of at least one of Cu, Pt, Ag, Au, and Al.

* * * * *